(12) United States Patent
Wang et al.

(10) Patent No.: US 10,283,987 B1
(45) Date of Patent: May 7, 2019

(54) DYNAMIC ADJUSTMENT OF CAPACITY THRESHOLD FOR A BATTERY UNIT

(71) Applicant: Amazon Technologies, Inc., Seattle, WA (US)

(72) Inventors: Ligong Wang, Seattle, WA (US); Darin Lee Frink, Lake Tapps, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/889,630

(22) Filed: Feb. 6, 2018

(51) Int. Cl.
*G08B 21/00* (2006.01)
*H02J 7/00* (2006.01)
*G01R 31/36* (2019.01)

(52) U.S. Cl.
CPC ........ *H02J 7/0047* (2013.01); *G01R 31/3606* (2013.01); *G01R 31/3648* (2013.01); *G01R 31/3693* (2013.01); *H02J 7/0063* (2013.01); *H02J 2007/005* (2013.01)

(58) Field of Classification Search
CPC .. H02J 7/0047; H02J 7/0063; H02J 2007/005; H02J 7/007; H02J 7/0052; H02J 7/04; G01R 31/3693; G01R 31/3648; G01R 31/3606; H01M 10/48; H01M 10/46; H01M 10/052; H01M 10/44; H01M 10/54; Y02W 30/84
USPC .............. 340/636.16, 636.1, 636.12, 636.13, 340/636.17, 636.19, 636.2, 635
See application file for complete search history.

(56) References Cited

U.S. PATENT DOCUMENTS

| | | | | |
|---|---|---|---|---|
| 6,064,857 A | * | 5/2000 | Wiedeman | H04B 1/56 455/127.1 |
| 2007/0194759 A1 | * | 8/2007 | Shimizu | H02J 7/0016 320/166 |
| 2015/0032394 A1 | * | 1/2015 | Kimura | H05K 999/99 702/63 |
| 2015/0357686 A1 | * | 12/2015 | Lee | H01M 10/637 307/23 |
| 2015/0377971 A1 | * | 12/2015 | Keating | G01R 31/3606 307/130 |
| 2016/0028254 A1 | * | 1/2016 | Honoki | H01M 10/44 320/162 |

* cited by examiner

*Primary Examiner* — Anh V La
(74) *Attorney, Agent, or Firm* — Kilpatrick Townsend & Stockton LLP

(57) ABSTRACT

Described herein is a smart battery unit capable of assessing its suitability to support a particular load. In some embodiments, the battery unit may receive an indication of power requirements for the particular load with respect to a period of time and may evaluate a total electrical capacity that would be required to support such a load based on those power requirements. The battery backup unit may monitor and dynamically update a full-charge capacity value related to its battery cells as well as the capacity requirement related to the load. The two values may then be compared to determine whether the battery backup unit is capable of supporting the load. If the full-charge capacity value is less than the capacity requirement for the load, then the battery unit may determine that it is not suitable for that load.

18 Claims, 5 Drawing Sheets

DYNAMIC ADJUSTMENT OF CAPACITY THRESHOLD FOR A BATTERY UNIT

BACKGROUND

Many critical electrically-powered systems include one or more battery backup units that provide backup power to the system in the event of a loss of utility power. Battery backup units, however, can degrade over time to a point of not being capable of providing adequate backup power to the system in the event of loss of utility power.

Some batteries, which may be referred to as smart batteries, may include a built-in battery management unit (BMU) which is configured to deduce the state of the cells of the battery based on internally measured voltage and current. In some cases, a smart battery may be configured to indicate when it can no longer meet certain performance criteria. For example, as a battery ages, the full-charge capacity (i.e., the total Amp-hours available at a specified discharge current) for that battery declines over use. When the BMU detects that the full-charge capacity for a battery has fallen below some predetermined threshold, the BMU may indicate that the battery is no longer good. However, this predetermined threshold, as well as other performance criteria, is set by a manufacturer of the smart battery and is not appropriate for all load types. In some cases, a load on a particular battery may require a greater or lesser full-charge capacity. In these cases, the smart battery may report that it is no longer good well after a replacement is actually needed (risking failure of critical systems) or before replacement is actually needed (resulting in inefficient replacement of battery resources).

At least some embodiments of the invention address these and other problems, individually and collectively.

BRIEF DESCRIPTION OF THE DRAWINGS

Various embodiments in accordance with the present disclosure will be described with reference to the drawings, in which.

DETAILED DESCRIPTION

Figure 1:
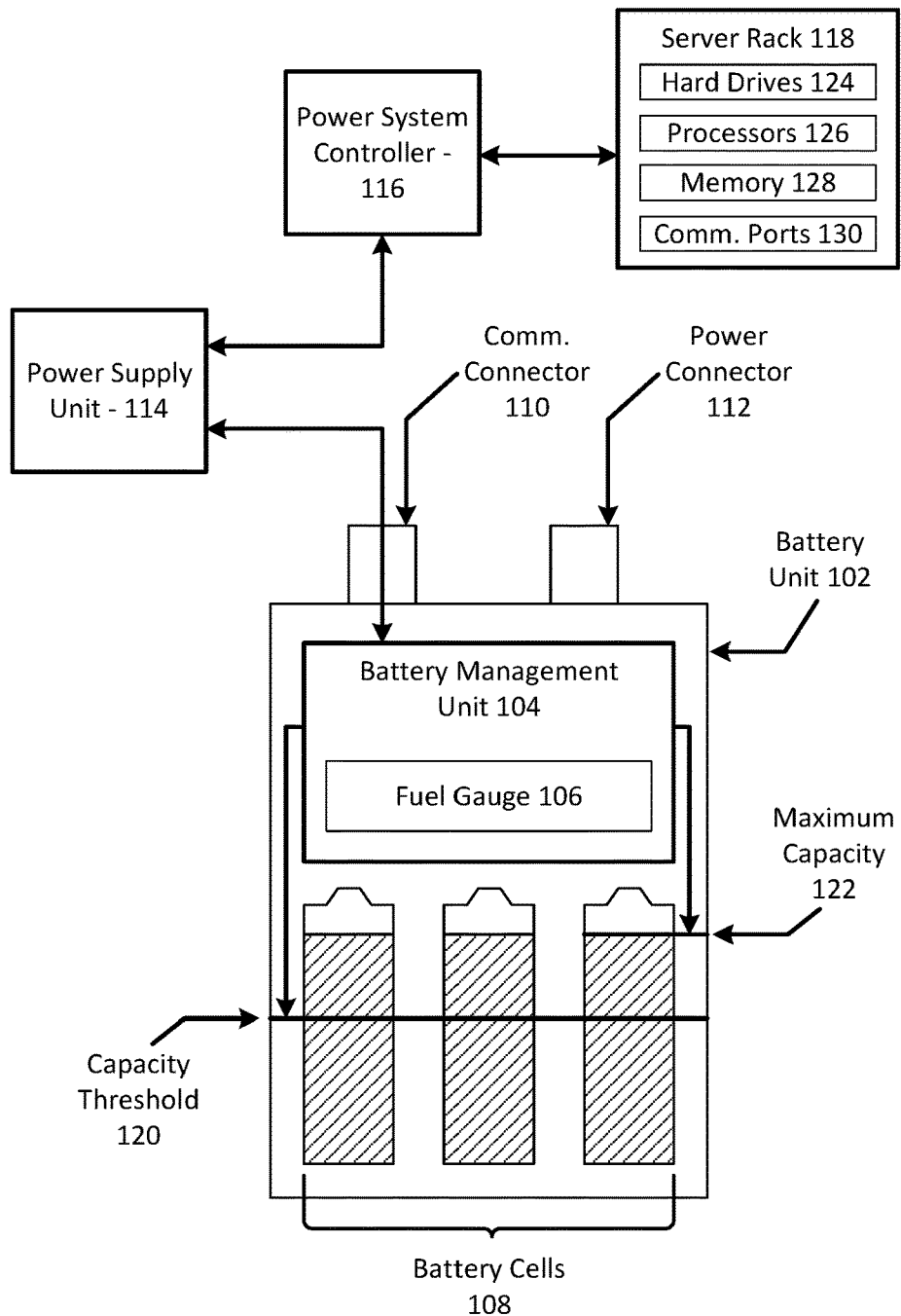
FIG. 1 depicts a schematic diagram of a smart battery unit which is capable of assessing its suitability for a current load in accordance with at least some embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Described herein is a smart battery backup unit capable of assessing its suitability to support a particular load. In some embodiments, the battery backup unit may receive an indication of power requirements (e.g., current and/or voltage requirements) for the particular load with respect to a period of time and may evaluate a total capacity that would be required to support such a load based on those power requirements. The battery backup unit may monitor and dynamically update a full-charge capacity value related to its battery cells as well as the capacity requirement related to the load. The two values may then be compared to determine whether the battery backup unit is capable of supporting the load.

In some embodiments, a battery backup unit may include a battery management unit that is configured to provide an indication as to whether the battery backup unit is able to support a particular load for a specified period of time. To do this, the battery management unit may compare a full-charge capacity value of the battery cells in the battery backup unit to a capacity threshold required for the particular load. A full-charge capacity value of the battery cells may be an indication of a total amount of energy that can be discharged from the battery cell from the maximum state of charge of the battery cell to a lower state of charge. A capacity threshold may be an indication of an amount of energy required to support a load.

The battery management unit may determine a full-charge capacity value of the backup battery cells in a number of ways. For example, the full-charge capacity value of the battery cells may be determined as an amount of current discharged during a discharge cycle in which the battery units are discharged from a maximum state of charge of the battery cells to a lower state of charge. In another example, the full-charge capacity of the battery cells may be determined as an amount of current charged during a charge cycle in which the battery units are charged from a lowest state of charge of the battery cells to a maximum state of charge. In some embodiments, the full-charge capacity value may be updated periodically.

The battery management unit may determine a capacity threshold for the load as a function of an amount of current required by the load as well as a minimum amount of time that the load should be supported for. In some embodiments, one or both of these values may be provided by an external source. In some embodiments, the battery management unit may be in communication with a current sensor of the battery backup unit that is able to sample current discharged to the load. In some embodiments, the minimum amount of time that a load should be supported for may be some hard-coded value (e.g., ½ hour, 1 hour, etc.) provided by the manufacturer of the battery backup unit.

Using the information above, the battery management unit of the battery backup unit may be configured to determine whether the full-charge capacity value for the battery cells is greater than a capacity threshold. If the full-charge capacity value for the battery cells is greater than a capacity threshold, then the battery management unit may determine that the battery backup unit is able to support the load. If the full-charge capacity value for the battery cells is less than the capacity threshold, then the battery management unit may determine that the battery backup unit is not able to support the load. In this scenario, the battery backup unit may request replacement. In this way, the battery backup unit is able to determine not just whether it should be replaced, but whether it should be replaced with respect to a particular load.

FIG. 1 depicts a schematic diagram of a smart battery unit which is capable of assessing its suitability for a current load in accordance with at least some embodiments. The battery unit 102 depicted in FIG. 1 may include a battery management unit 104, which may include a fuel gauge 106, and a number of battery cells 108. Additionally, the battery unit may contain a number of connectors, such as a communication connector 110 and a power connector 112. The battery unit 102 may be configured to communicate (e.g., via the communication connector 110) to a number of other electronic devices. For example, the battery unit 102 may be configured to communicate with a power supply unit 114 and/or a power system controller 116. Additionally, the power system controller may be in communication with a server rack 118, which houses a number of components.

The battery management unit 104 may be any component within the battery unit 102 configured to manage one or more aspects or functionality of the battery unit 102. In some embodiments, the battery management unit 104 may be implemented on an integrated circuit. The battery management unit 104 may be configured to, along with the performance of a number of other functions, determine whether the battery unit 102 is suitable to support a particular load. To do this, the battery management unit 104 may receive data from one or more of the fuel gauge 106, the power supply unit 114, or the power system controller 116. Based on this received data, the battery management unit 104 may determine a capacity threshold 120 associated with the load and a full-charge capacity 122 associated with the battery cells 108. The fuel gauge 106 may include a current sensor and/or a voltage sensor.

The term capacity, as used herein, refers to an amount of electric charge. For example, a full-charge capacity may refer to the greatest amount of electric charge that can be stored by a battery in its current state. A capacity threshold may refer to an amount of electric charge required to support a load over a period of time. It should be noted that capacity is generally expressed in units of ampere hours (Ah) or milliampere hours (mAh). These units have dimensions of electric current multiplied by time, which equate to the charge transferred by a steady current over some period of time. For example, one ampere flowing for one hour is equal to 1 ampere hour (or 3600 coulombs). To determine a capacity threshold for a particular load, the system may multiply an amount of current that the load consumes and multiply that amount by some predetermined minimum amount of time that the load must be supported for in the event of a power loss. In a battery system, it is worth noting that accurate calculation of the energy delivered by the battery requires integration of the power delivered over the discharge interval, as generally, the battery voltage varies during discharge (e.g., voltage declines throughout the discharge). However, an average value or nominal value may be used to approximate the integration of power.

In some embodiments, the power system controller 116 may be configured to be mounted in a shelf of a server rack 118 and operatively coupled with DC bus bars of the server rack 118 to supply DC power to system loads mounted in the server rack. The server rack may be configured to control each of the power supply units 114 included in a power supply system. In some embodiments, the server rack 118 may house one or more system loads which consist of some combination of hardware components. For illustrative purposes, these hardware components may include hard drives 124, processors 126 (e.g., central processing units (CPUs)), memory 128 (either volatile or non-volatile), communication ports 130 (e.g., USB ports), or any other suitable electronic components. In some embodiments, the power system controller 116 may be configured to determine, from the combination of hardware components included in the system load and the power ratings for each of those components, a power requirement for the system load. The power requirement may be communicated to the power supply unit 114, which may subsequently convey the power requirement to the battery management unit 104.

Figure 2:
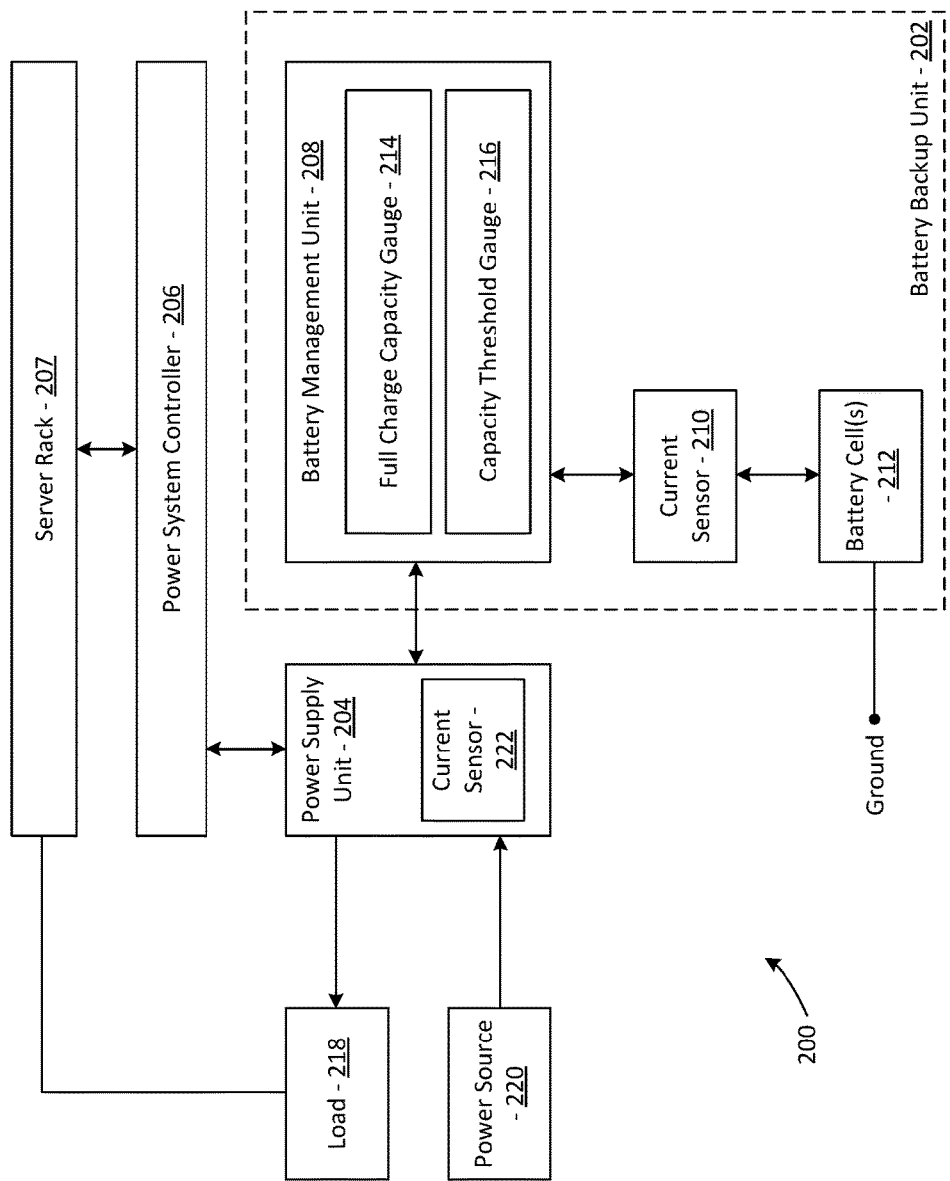
FIG. 2 depicts a schematic diagram of a power supply system that may be implemented in accordance with at least some embodiments.

FIG. 2 depicts a schematic diagram of a power supply system 200 that may be implemented in accordance with at least some embodiments. The power supply system 200 may include a battery backup unit 202, a power supply unit 204, and a power system controller 206. Additionally, the power system controller 206 may be in communication with a server rack 207, which may be an example of server rack 118 depicted in FIG. 1. The battery backup unit 202 may be an example battery unit 102 as described with respect to FIG. 1, and may include a battery management unit 208, a current sensor 110, and one or more battery cells 212. The battery management unit 208 may include at least a full-charge capacity gauge 214 that determines and maintains an indication of an amount of energy that can be discharged from the battery cell(s) 212 from the maximum state of charge of the battery cell(s) 212 to a lower state of charge (e.g., a state of charge below which the battery management unit 208 blocks further discharge of the battery cell(s) 212 to prevent an undesirable under-voltage condition). The battery management unit 208 may also include a capacity threshold gauge 216 that determines and stores an indication of a value which represents a minimum amount of energy need to support a particular load over a period of time. The battery management unit 208 can have any suitable configuration. For example, the battery management unit 208 can include one or more processors and a memory device that stores an algorithm or formula used by the full-charge capacity gauge 214 as well as the capacity threshold gauge 216. In some embodiments, the battery management unit 208 may be implemented as an integrated circuit installed within the battery backup unit 202. For example, the battery management unit 208 may be a system on chip (SoC), an application-specific integrated circuit (ASIC), or a field programmable gate array (FPGA). In some embodiments, the capacity threshold may be dynamically updated as new information is received.

In some embodiments, the power supply unit 204 is operable to supply electrical power (e.g., direct current (DC) power, alternating current (AC) power) to a load 218 at a rate (variable or constant) drawn by the load 218. Load 218 may be managed by the server rack 207. The power supply unit 204 is operable to generate the electrical power supplied to the load 218 from electrical power (e.g., DC power, AC power) supplied to the power supply unit 204 by a power source 220. In the event that the power source 220 is incapable of supplying adequate electrical power to the power supply unit 204 to satisfy the power requirements of the load 218 (e.g., when the power source 220 is a utility power source that is experiencing a temporary outage), the power supply unit 204 is operable to draw DC power from the battery backup unit 202 and generate the electrical power supplied to the load 218 from the DC power drawn from the battery backup unit 202. In some embodiments, DC power drawn from the battery backup unit 202 may be converted into AC power using a power inverter. Additionally, a voltage or current flow of the DC power may be adjusted using a converter.

In some embodiments, the power supply unit 204 is operable to supply DC power to the battery backup unit 202 to charge the battery cell(s) 212. For example, in many embodiments, when the power source 220 is capable of supplying adequate electrical power to the power supply unit 204, the power supply unit 204 can simultaneously supply electrical power to the load 218 and DC power to the battery backup unit 202 to charge the battery cell(s) 212 to a predetermined high charge level (e.g., a maximum charge level for the battery backup unit 202).

In some embodiments, the power system controller 206 is configured to control operation of the power supply unit 204 so as to calibrate the full-charge capacity gauge 214 and/or the capacity threshold 216. Over time, the full-charge capacity gauge 214 can become inaccurate with respect to the actual amount of energy that can be discharged by the battery cell(s) 212 from a maximum state of charge. For example, over time, energy can be slowly discharged from the battery cell(s) 212 via one or more leakage currents that are not measured by the current sensor 110. Because the leakage current(s) is not measured by the current sensor 110, the full-charge capacity gauge 214 may not update a full-charge capacity value to reflect the energy discharged from the battery cell(s) 212 by the leakage current(s). As a result, over time, the full-charge capacity gauge 214 can increasingly overestimate the amount of energy available to be discharged from the battery cell(s) 212. In many embodiments, the power system controller 206 controls operation of the power supply unit 204 to conduct a capacity calibrating discharge/charge cycle of the battery backup unit 202 to calibrate the full-charge capacity gauge 214 by causing the battery cells 212 to be discharged and subsequently recharged.

In some embodiments, a full-charge capacity value is continually updated by the full-charge capacity gauge 214 based on the amount of current flowing into and out of battery cell(s) 212 as sensed by the current sensor 110 and a voltage level of the battery cells(s) 212. For example, during discharge of energy from the battery cell(s) 212 to the power supply unit 204, the current flowing from the battery cell(s) 212 is detected by the current sensor 110, which transmits a signal to the battery management unit 208 indicative of the magnitude of the current flowing from the battery cell(s) 212. The battery management unit 208 processes the signal from the current sensor 110 in combination with a voltage of the battery cell(s) 212 and elapsed time to measure energy discharged from the battery cell(s) 212. The battery management unit 208 may then update the full-charge capacity value to reflect a full-charge capacity of the battery cell(s) 212 based on the amount of energy discharged from the battery cell(s) 212. In some embodiments, the full-charge capacity value may be updated by the full-charge capacity gauge 214 during a charge cycle. For example, during charging of the battery cells(s) 212, the battery management unit 208 processes the signal from the current sensor 110 in combination with a voltage of the battery cell(s) 212 and elapsed time to measure the energy charged into the battery cell(s) 212. The full-charge capacity gauge 214 of the battery management unit 208 may repeatedly update a stored full-charge capacity value for the battery backup unit 202 to reflect the amount of energy charged into the battery cell(s) 212. In some embodiments, the full-charge capacity gauge 214 updates a full-charge capacity value for the battery units 212 upon determining that the battery units have been fully charged or fully discharged. In these embodiments, the full-charge capacity value may be updated to reflect the total amount of energy that can be discharged by the battery units 212.

In some embodiments, a capacity threshold value is continually updated by the capacity threshold gauge 216 based on power usage data received in relation to a load 218. In some embodiments, the power usage data may be received from the current sensor 210 while the battery backup unit 202 is supporting the load 218. In some embodiments, the power usage data may be received by the battery management unit 208 from the power supply unit 204 which supports the load 218. In these embodiments, the power supply unit 204 may measure an amount of current that is used by the load over some period of time (e.g., 1 month) using a current sensor 222 installed in the power supply unit 204. In some cases, the power usage data provided by the power supply unit 204 may be an average current consumed by the load 218. In some embodiments, the power usage data provided by the power supply unit 204 may be a highest amount of current consumed by the load 218 during the period of time for which current has been measured. In some embodiments, the power usage data may be provided to the battery management unit 208 by a power system controller 206. In these embodiments, the power system controller 206 may determine the power usage data based on a composition of the load 218. For example, the power system controller 206 or the server rack 207 may identify each of the components from which the load 218 is comprised and may identify a corresponding power requirement (e.g., power rating) for that component. Power requirements for each component may represent an average amount of current typically consumed by that particular type of component. In this example, the power requirements for each component in the load 218 may be summed to determine a total power requirement for the load.

Upon receiving the power usage data related to the load 218, the battery management unit 208 may estimate the capacity threshold value by multiplying the power usage data for the load by some minimum amount of time for which the load should be supported. In some embodiments, a default amount of time may be stored by the battery management unit 208. For example, the battery management unit 208 may be configured to determine whether a particular load may be supported for at least one hour. In some embodiments, the minimum support time (i.e., the minimum amount of time for which the load should be supported) may be provided by one of the power supply unit 204 or the power system controller 206. The minimum support time may be determined based on a criticality of the load, which may be determined based on a composition, or type, of the load.

For clarity, a certain number of components are shown in FIG. 2. It is understood, however, that embodiments of the invention may include more than one of each component. In addition, some embodiments of the invention may include fewer than or greater than all of the components shown in FIG. 2. In addition, the components in FIG. 2 may communicate via any suitable communication medium, using any suitable communication protocol.

Figure 3:
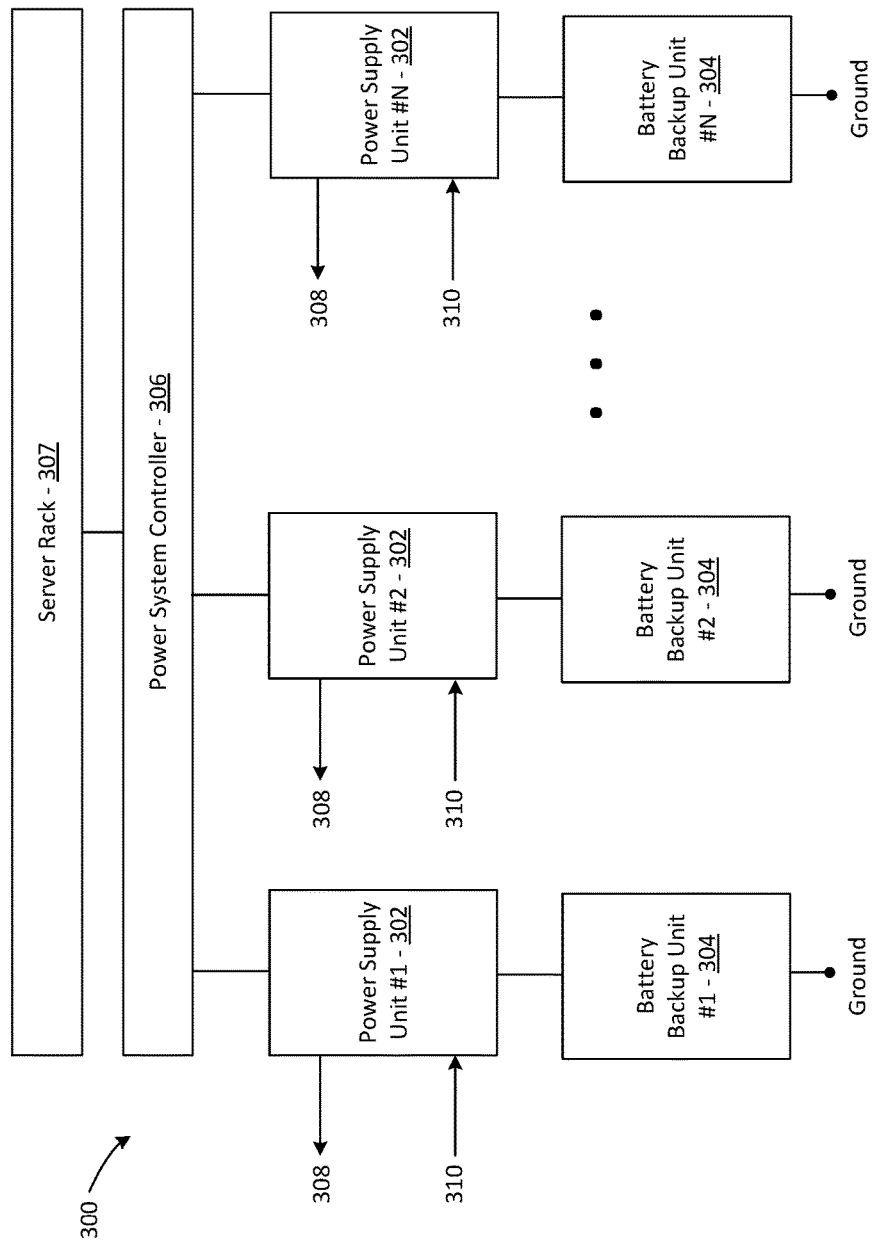
FIG. 3 is a simplified schematic diagram depicting a power supply system that may include multiple of the battery backup units described in accordance with some embodiments.

FIG. 3 is a simplified schematic diagram depicting a power supply system 300 that may include multiple of the battery backup units described in accordance with some embodiments. The power supply system 300 is similar to the power supply system 200, but includes multiple pairs of a respective power supply unit 302 and a respective battery backup unit 304. Any suitable number of pairs of the power supply unit 302 and the battery backup unit 304 can be included in the power supply system 300. For example, the power supply system 300 may include some number N pairs of battery backup units 304 and power supply units 302, where N is some positive integer.

In some embodiments, the power supply system 300 may be configured to be mounted in a shelf of a server rack and operatively coupled with DC bus bars of the server rack to supply DC power to system loads mounted in the server rack. The power supply system 300 includes a power system controller 306 that is configured similar to the power system controller 206 of the power supply system 200 with the power system controller 306 being configured to control each of the power supply units 302 included in the power supply system 300. The power system controller 306 may be in communication with a server rack 307. In some embodiments, the power system controller 306 or server rack 307 may be configured to assess a composition of a load supported by the power supply units 302 and estimate power requirements for that load. The load may comprise a number of hardware components housed in, and managed by, the server rack 307. For example, it may be determined that the load includes a number X of some Component 1, a number Y of some Component 2, and a number Z of some Component 3. In this example, the power system controller 306 may determine that Component 1 typically consumes 1 ampere, Component 2 typically consumes 2 amperes, and Component 3 typically consumes 3 amperes. Hence, the power requirement may be estimated in this example as X+2Y+3Z. Power requirements may be provided in any units of current (e.g., amperes or milliamperes). In some embodiments, the power requirements for each component may be determined based on power ratings stored with respect to that component. In some embodiments, the power requirements for each component may be determined based on current information received from each component. For example, the power system controller 306 may communicate with each of the components of the load in order to obtain power requirements for each of those components. The power system controller 306 may be configured to communicate this power requirement to the battery backup unit 302. In some embodiments, the power system controller 306 may convey the power usage data to a power supply unit 302, which may, in turn, convey the power usage data to the backup battery system 302.

In some embodiments, the power system controller 306 may also be configured to determine an appropriate amount of time for which a load should be supported in the event of a temporary power outage (i.e., a minimum support time). In some embodiments, the minimum support time may be determined based on a criticality of the load. In some embodiments, the minimum support time may be determined based on an amount of time required by the load to save data and properly power down. In some embodiments, the power system controller 306 may record an average or maximum amount of time for which temporary power outages occur over some period of time and may set that amount as the minimum support time for the load. Similar to the power usage data, the minimum support time value may be conveyed from the power system controller 306 to the battery backup unit 304.

In the illustrated embodiment, each of the power supply units 302 may be connected to the load 308 (e.g., via DC bus bars of the server rack) and the power source 310. During normal operation, the power source 310 supplies electrical power to each of the power supply units 302 and each of the power supply units 302 supply electric power to the load 308. In some embodiments, one or more of the power supply units 302 may be automatic transfer switch power supply units (ATSPSUs) capable of drawing power from multiple power sources 310 and automatically switching between those multiple sources upon detecting a loss of power from one or more of the sources. For example, the power supply units may be configured to automatically switch from drawing power from the power source 310 to drawing power from the battery backup unit 304 upon detecting an outage in the power source 310. In some embodiments, the power supply units 302 may be configured to record a maximum power usage of the load over a given period of time (e.g., one month, one week, etc.). The power supply units 302 may report this power usage information to the battery backup units 304.

In some embodiments, each power supply unit 302 may be configured to assess power requirements for a load supported by that power supply unit 302. For example, the power supply units 302 may monitor and record power usage data for a load over some period of time and may identify the power requirements for that load as an average current consumed by the load or a highest amount of current consumed by the load at any point during the period of time. For example, the power supply unit 302 may monitor the power consumed by the load over a 1-month period and may keep track of the highest amount of current provided to the load by that power supply unit 302. In the previous example, the 1-month period may be a "rolling" 1-month period so that the power usage data provided to the battery backup unit 304 represents the highest amount of current consumed during the 1-month period immediately preceding the determination of the power usage data. The power usage data may be periodically updated or may be updated dynamically as new data is received. For example, power usage data may be updated as a new higher amount of current is detected as being consumed by the load.

In some embodiments, each battery backup unit 304 may include a battery management unit which is configured to determine a full-charge capacity for battery cells in the battery backup unit 304 as well as a capacity threshold value to be associated with a particular load. A process for determining each of these values is described in greater detail elsewhere. The capacity threshold may be determined using power usage data obtained with respect to the load. As described above, in various embodiments, the power usage data may be provided to the battery backup unit 304 by the power system controller 306 or the power supply unit 302. In some embodiments, the power usage data may be obtained by the battery backup unit 304 from a current sensor included in the battery backup unit 304. For example, the battery backup unit 304 may monitor the amount of current drawn upon by a particular load while that load is being supported by the battery backup unit 304.

Figure 4:
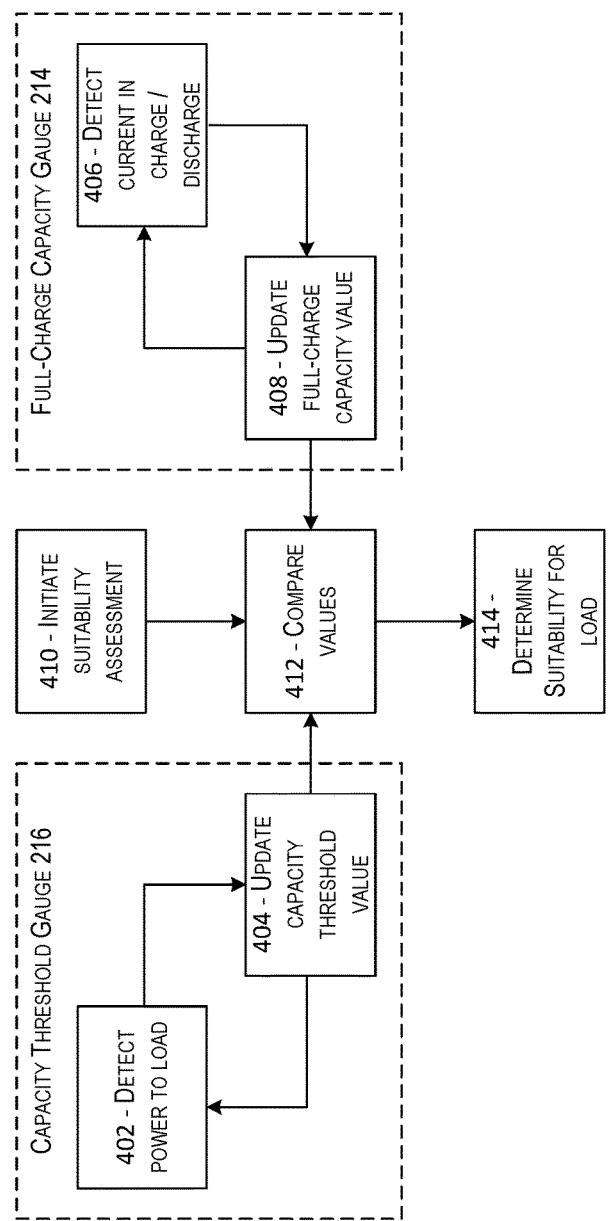
FIG. 4 depicts an illustrative flow chart demonstrating an example process for determining a suitability of a battery unit for a load in accordance with at least some embodiments.

FIG. 4 depicts an illustrative flow chart demonstrating an example process for determining a suitability of a battery unit for a load in accordance with at least some embodiments. The process 400 is illustrated as a logical flow diagram, each operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types.

The order in which the operations are described is not intended to be construed as a limitation, and any number of the described operations can be omitted or combined in any order and/or in parallel to implement this process and any other processes described herein.

Some or all of the process 400 (or any other processes described herein, or variations and/or combinations thereof) may be performed under the control of one or more processors with executable instructions that may be implemented as code. In accordance with at least one embodiment, the process 400 of FIG. 4 may be performed by at least the battery management unit 208 shown in FIG. 2. The executable instructions may be stored on a computer-readable storage medium, for example, in the form of a computer program including a plurality of instructions executable by one or more processors. The computer-readable storage medium may be non-transitory.

Process 400 may be performed by a battery management unit that includes a full-charge capacity gauge 214 and a capacity threshold gauge 216. The full-charge capacity gauge 214 and capacity threshold gauge 216 may be examples of the respective full-charge capacity gauge 214 and the capacity threshold gauge 216 as described with respect to FIG. 2 above. In some embodiments, the capacity threshold gauge 216 and/or the full-charge capacity gauge 214 may be implemented as separate circuits within the battery management unit, each of which may operate in parallel. It should be noted that some embodiments of the disclosure may not include a capacity threshold gauge 216. For example, a capacity threshold value may be provided to the battery unit by some electronic device external to the battery unit, such as a power system controller or a power supply unit.

The capacity threshold gauge 216 may be configured to constantly update a capacity threshold value associated with a current load. To do this, the capacity threshold gauge 216 may detect a current consumed by the load while the battery unit is supporting the load at 402. In some embodiments, the capacity threshold gauge may identify the current to the load based on the peak current drawn by the load during the time over which the load is being supported by the battery unit. In some embodiments, the capacity threshold gauge may identify the current to the load based on an average current drawn by the load during the time over which the load is being supported by the battery unit. The capacity threshold gauge may update a capacity threshold value stored by the battery unit at 404. To determine a capacity threshold value, the capacity threshold gauge 216 may multiply the current to the load identified at 402 to some minimum support time.

The full-charge capacity gauge 214 may be configured to constantly update a full-charge capacity value associated with one or more battery cells of the battery unit. In some embodiments, this may involve detecting an amount of current to or from the battery units during a charge or discharge cycle at 406. For example, the full-charge capacity gauge 214 may determine an average current flow to or from the battery cells and then multiply that average current flow by an amount of time for which that the charge/discharge cycled lasted. The full-charge capacity gauge 214 may then update a full-charge capacity value stored by the battery unit at 408. In some embodiments, steps 406 and 408 may be performed each time that a charge/discharge cycle is initiated.

At 410, the battery unit may initiate a suitability assessment. In some embodiments, the suitability assessment may be initiated upon receiving some request to do so. For example, a user may press a button or perform some other action which causes the battery unit to determine that a suitability assessment is required. In some embodiments, the battery unit may initiate the suitability assessment on a periodic basis. In some embodiments, the battery unit may initiate the suitability assessment automatically each time that the battery unit detects that one of the capacity threshold value or the full-charge capacity value has been updated.

Upon initiation of the suitability assessment, the battery unit may compare the capacity threshold value to the full-charge capacity value at 412. Each of the capacity threshold value and the full-charge capacity value may be represented using the same units of measurement. Accordingly, the comparison may involve determining whether the full-charge capacity value is greater than the capacity threshold value. Based on this comparison, the battery unit may determine whether it is suitable for the load at 414. For example, if the full-charge capacity value is greater than the capacity threshold value, then the battery unit may be determined to be suitable for the load. Otherwise, if full-charge capacity value is less than the capacity threshold value, then the battery unit may determine that it is not suitable for the load.

Figure 5:
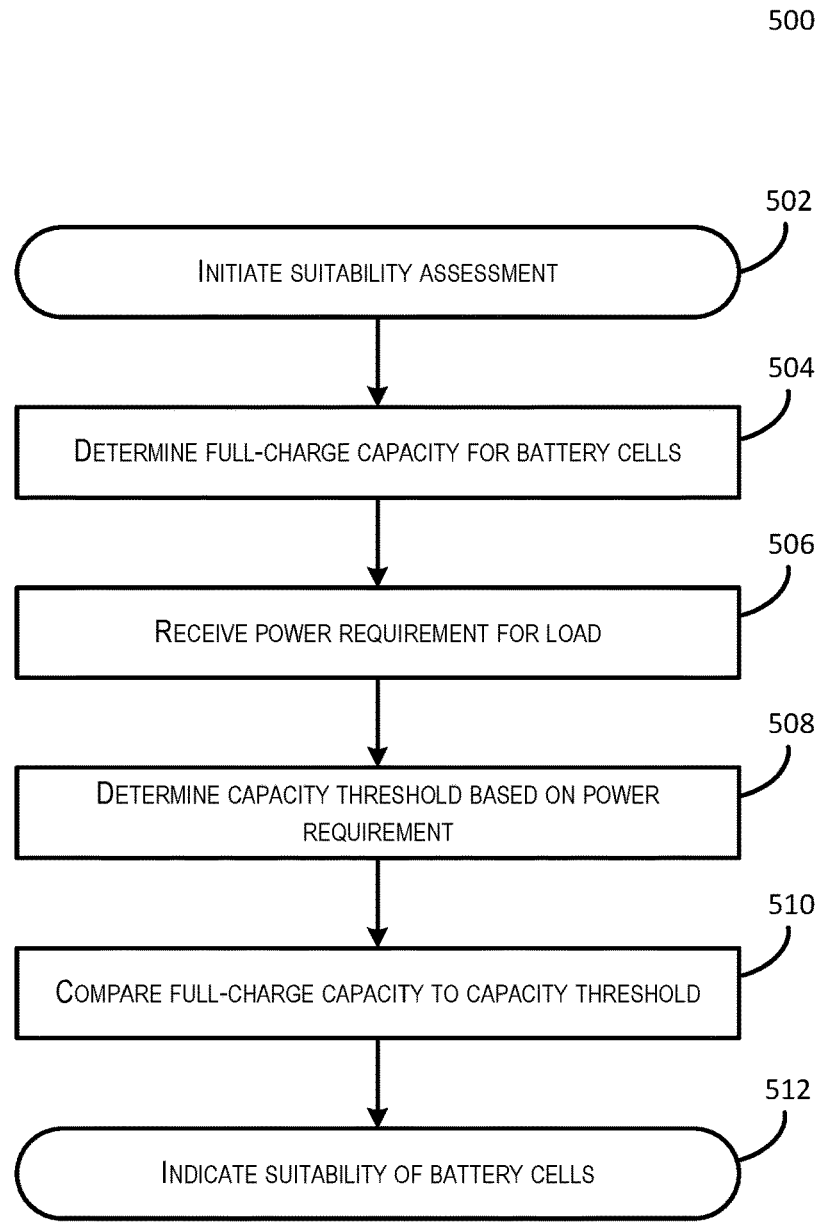
FIG. 5 depicts a flow diagram illustrating a method for providing an indication that a battery unit is not suitable for a load that may be performed in accordance with at least some embodiments.

FIG. 5 depicts a flow diagram illustrating a method for providing an indication that a battery unit is not suitable for a load that may be performed in accordance with at least some embodiments. In accordance with at least one embodiment, the process 500 of FIG. 5 may be performed by at least the battery management unit 208 shown in FIG. 2.

Process 500 may begin at 502, when a suitability assessment is initiated with respect to a battery backup unit. In some embodiments, the suitability assessment may be initiated on a periodic basis. At least some of the steps described in relation to process 500 may be performed by at least the battery management unit 208 shown in FIG. 2.

At 504, the process may involve determining, based on information related to a current to or from one or more battery cells, a full-charge capacity value associated with the one or more battery cells. As described elsewhere, the current to or from battery cells may be obtained via a fuel gauge (which may include at least a current sensor) in the battery unit. In some embodiments, the current to or from the battery cells may be measured during either a charge or discharge cycle of the battery cells. In some embodiments, a discharge cycle and a subsequent recharge cycle may be initiated by a power system controller 206 in order to obtain a full-charge capacity value for the battery cells.

At 506, the process may involve receiving a power requirement for a load supported by the one or more battery cells. As described elsewhere, the power requirement for the load may be obtained by the battery unit (e.g., via a current sensor while supporting the load) or the power requirement for the load may be provided by some external electronic device such as a power supply unit or a power system controller. In some embodiments, the power requirement for the load may be determined as a sum of the power requirements for each of the components in the load. In some embodiments, the power requirement for the load may be determined based on an amount of current consumed by the load over some preceding period of time (e.g., the preceding month). For example, the power requirements of the load may be determined as an average amount of current consumed by the load over that period of time or a highest (e.g., peak) amount of current consumed by the load during that period of time.

At 508, the process may involve determining, based on the power requirements, a capacity threshold value to be associated with the load. In some embodiments, this may involve multiplying the power requirements for the load by some minimum period of time for which the load should be supported. In some embodiments, the battery unit may maintain a default minimum support time value which represents the minimum period of time for which the load should be maintained. In some embodiments, the battery may receive an indication of the minimum support time from an electronic device external to the battery unit such as a power supply unit or a power system controller.

At 510, the process may involve comparing the full-charge capacity value associated with the one or more battery cells to the capacity threshold value associated with the load. In some embodiments, each of the full-charge capacity value and the capacity threshold value may be stored in comparable units (e.g., milliampere hours). Hence, the comparison may involve simply determining whether the full-charge capacity value is greater than the capacity threshold value.

At 512, the process may involve indicating a suitability of the battery unit for the supported load. For example, upon determining that the full-charge capacity value associated with the one or more battery cells is less than the determined capacity threshold associated with the load, providing an indication that the battery backup unit is insufficient to power the load. In some embodiments, providing the indication may involve activating some indicator, such as an LED. In some embodiments, the battery unit may provide an indication by transmitting a signal to some external electronic device, such as a power supply unit or a power system controller.

Embodiments of the disclosure may provide a number of technical advantages over conventional systems. For example, where most smart battery units provide only an indication as to whether they are still suitable for use with respect to some predefined metrics, the battery unit described herein is capable of determining whether it is suitable for a particular load. Hence, a user can quickly and easily determine whether a battery can be used to support any particular load. This enables the battery unit to be moved from more power-intensive systems to less power-intensive systems as its full-charge capacity decreases with use instead of being discarded. This ultimately enables the maximization of the use of the battery unit. Additionally, embodiments of this disclosure ensure that critical power-intensive systems are properly supported in the event of a power outage.

The specification and drawings are described herein are to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Embodiments of this technology are described herein, including the various modes known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A battery backup unit, comprising:
 a current sensor;
 one or more battery cells;
 a battery management unit that comprises a processor and a memory including instructions that, when executed with the processor, cause the battery management unit to, at least:
  receive, from the current sensor, information related to a current to or from the one or more battery cells;
  determine, based on the information related to the current, a full-charge capacity value for the one or more battery cells;
  receive a power requirement for a load supported by the battery backup unit, the power requirement for the load comprising an amount of energy consumed by the load during some preceding period of time;
  determine, based on the power requirements, a capacity threshold to be associated with the load that comprises an amount of energy required by the load over a predetermined period of time, wherein the capacity threshold is a product of the power requirement for the load and the predetermined period of time;

compare the full-charge capacity value for the one or more battery cells to the capacity threshold associated with the load; and upon determining that the full-charge capacity value for the one or more battery cells is less than the determined capacity threshold associated with the load, provide an indication that the battery backup unit is insufficient to power the load.

2. The battery backup unit of claim 1, wherein the full-charge capacity value associated with the one or more battery cells is determined based on information related to the current to or from the one or more battery cells during a charge or discharge cycle.

3. The battery backup unit of claim 1, wherein the battery management unit is implemented on an integrated circuit.

4. The battery backup unit of claim 1, wherein the power requirement for the load comprises a peak current consumed by the load during the preceding period of time.

5. The battery backup unit of claim 1, wherein the predetermined period of time corresponds to an average or maximum amount of time for which temporary power outages have occurred over the preceding period of time.

6. A method comprising:
   determining, based on information related to a current to or from a battery cell, a full-charge capacity value associated with the battery cell;
   receiving a power requirement for a load supported by the battery cell based on an amount of energy consumed by the load during some preceding period of time;
   determining, based on the power requirements, a capacity threshold to be associated with the load by multiplying the power requirement for the load by a desired support time;
   comparing the full-charge capacity value associated with the battery cell to the capacity threshold associated with the load; and
   upon determining that the full-charge capacity value associated with the battery cell is less than the determined capacity threshold associated with the load, providing an indication that a battery backup unit that includes the battery cell is insufficient to power the load.

7. The method of claim 6, wherein providing the indication that the battery backup unit is insufficient to power the load comprises activating an LED.

8. The method of claim 6, wherein the providing the indication that the battery backup unit is insufficient to power the load comprises transmitting a signal to an external electronic device.

9. The method of claim 6, wherein the current to or from the battery cell is obtained via a current sensor.

10. The method of claim 6, wherein the current to or from the battery cell is determined during either a charge cycle or discharge cycle of the battery cell.

11. The method of claim 6, wherein the power requirement comprises a highest current consumed by the load within some preceding period of time.

12. A power system comprising:
    a battery unit supporting a load, the battery unit comprising a battery cell and a battery management unit configured to:
      receive an indication of a power requirement of the load based on an amount of current consumed by the load within a preceding period of time;
      determine, based on the power requirement of the load, a capacity threshold value for the load by multiplying the power requirement of the load by a predetermined period of time;
      determine a full-charge capacity value associated with the battery cell;
      compare the full-charge capacity value to the capacity threshold value; and
      upon determining that the full-charge capacity value is less than the capacity threshold value, providing an indication that the battery unit is insufficient to support the load.

13. The power system of claim 12, further comprising a power supply unit between the load and the battery unit, and wherein the indication of the power requirement of the load is received from the power supply unit.

14. The power system of claim 13, wherein the power requirement of the load received from the power supply unit is based on the highest current consumed by the load within the preceding period of time.

15. The power system of claim 13, wherein the power requirement of the load received from the power supply unit is based on an average current consumed by the load within the preceding period of time.

16. The power system of claim 12, further comprising a power system controller, and wherein the indication of the power requirement of the load is received from the power system controller.

17. The power system of claim 12, further comprising a fuel gauge, and wherein the full-charge capacity value associated with the battery cell is determined by the fuel gauge.

18. The power system of claim 13, wherein the predetermined period of time is received from the power supply unit.

\* \* \* \* \*